(12) United States Patent
Noebauer

(10) Patent No.: US 11,575,041 B2
(45) Date of Patent: Feb. 7, 2023

(54) TRANSISTOR ARRANGEMENT WITH A LOAD TRANSISTOR AND A SENSE TRANSISTOR

(71) Applicant: Infineon Technologies Austria AG, Villach (AT)

(72) Inventor: Gerhard Noebauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 64 days.

(21) Appl. No.: 17/104,216

(22) Filed: Nov. 25, 2020

(65) Prior Publication Data

US 2021/0083104 A1 Mar. 18, 2021

Related U.S. Application Data

(62) Division of application No. 16/248,014, filed on Jan. 15, 2019, now Pat. No. 10,872,976.

(30) Foreign Application Priority Data

Jan. 16, 2018 (EP) ..................................... 18151843

(51) Int. Cl.
| | |
|---|---|
| *H01L 29/78* | (2006.01) |
| *H01L 29/40* | (2006.01) |
| *H01L 29/06* | (2006.01) |
| *H01L 29/08* | (2006.01) |
| *G01R 19/00* | (2006.01) |

(52) U.S. Cl.
CPC ...... *H01L 29/7815* (2013.01); *H01L 29/0696* (2013.01); *H01L 29/0865* (2013.01); *H01L 29/0882* (2013.01); *H01L 29/402* (2013.01); *H01L 29/407* (2013.01); *H01L 29/7813* (2013.01); *G01R 19/0092* (2013.01)

(58) Field of Classification Search
CPC ............. H01L 29/7815; H01L 29/7813; H01L 29/407; H01L 29/0696; H01L 29/402; H01L 27/088
See application file for complete search history.

(56) References Cited

U.S. PATENT DOCUMENTS

| | | | |
|---|---|---|---|
| 2014/0015046 A1* | 1/2014 | Thiele | ................. H01L 29/7815 257/334 |
| 2016/0079377 A1 | 3/2016 | Hutzler et al. | |
| 2019/0081624 A1 | 3/2019 | Zhang et al. | |

* cited by examiner

*Primary Examiner* — Julia Slutsker
(74) *Attorney, Agent, or Firm* — Murphy, Bilak & Homiller, PLLC

(57) ABSTRACT

A method of current detection includes providing a transistor arrangement which comprises a drift and drain region arranged in a semiconductor body and each connected to a drain node, a plurality of load transistor cells each having a source region integrated in a first region of the semiconductor body, a plurality of sense transistor cells each having a source region integrated in a second region of the semiconductor body, a first source node electrically connected to the source region of each of the plurality of the load transistor cells via a first source conductor, and a second source node electrically connected to the source region of each of the plurality of the sense transistor cells via a second source conductor; and detecting a first current flowing between the drain node and the first source node of the transistor arrangement, wherein detecting the first current includes measuring a second current flowing between the drain node and the second source node of the transistor arrangement.

4 Claims, 7 Drawing Sheets

TRANSISTOR ARRANGEMENT WITH A LOAD TRANSISTOR AND A SENSE TRANSISTOR

RELATED APPLICATIONS

The instant application is a divisional of and claims priority to U.S. application Ser. No. 16/248,014 filed on Jan. 15, 2019, the content of which is incorporated by reference in its entirety.

TECHNICAL FIELD

This disclosure in general relates to a transistor arrangement with a load transistor and a sense transistor.

BACKGROUND

Transistors such as MOSFETs (Metal Oxide Semiconductor Field-Effect Transistors) are widely used as electronic switches in various types of electronic circuits. In many applications it is desirable to measure the current flowing through the transistor, which may be referred to as load transistor.

One way of measuring a load current provided by the transistor (which may be referred to as load transistor) to the load is using a sense transistor. The sense transistor is connected to the load transistor and driven such that it is operated in the same operating point as the load transistor. Ideally, a sense current through the sense transistor is proportional to the load current, wherein a proportionality factor is given by a ratio between a size of the load transistor and a size of the sense transistor. The load transistor and the sense transistor may be implemented in a common semiconductor body and each include a plurality of transistor cells. The size ratio is then equivalent to a ratio between the number of transistor cells of the sense transistor and the number of transistor cells of the load transistor.

Due to parasitic effects, however, a proportionality factor between the sense current and the load current, which is referred to as current ratio in the following, does not exactly match the size ratio. In particular, these parasitic effects may have the effect that a deviation of the current ratio from the size ratio increases as the size of the sense transistor decreases relative to the size of the load transistor. On the other hand, it may be desirable to implement the sense transistor as small as possible in order to reduce losses associated with measuring the current.

It is therefore desirable to provide a transistor arrangement with a load transistor and a sense transistor which enables precisely measuring a load current in the load transistor using the sense transistor.

SUMMARY

One example relates to a transistor arrangement. The transistor arrangement includes a drift and drain region arranged in a semiconductor body and connected to a drain node, a plurality of load transistor cells each including a source region integrated in a first region of the semiconductor body, and a plurality of sense transistor cells each including a source region integrated in a second region of the semiconductor body. A first source node is electrically connected to the source region of each of the plurality of load transistor cells via a first source conductor having a first area specific resistance, and a second source node is electrically connected to the source region of each of the plurality of sense transistor cells via a second source conductor having a second area specific resistance, wherein the area specific resistance of the second source conductor is greater than the area specific resistance of the first source conductor.

Another example relates to a method. The method includes detecting a first current flowing between a drain node and a first source node of a transistor arrangement, wherein detecting the first current includes measuring a second current flowing between the drain node and a second source node of the transistor arrangement. The transistor arrangement includes a drift and drain region arranged in a semiconductor body and connected to a drain node, a plurality of load transistor cells each including a source region and a body region integrated in a first region of the semiconductor body, and a plurality of sense transistor cells each including a source region and a body region integrated in a second region of the semiconductor body. Further, the transistor arrangement includes a first source conductor having a first area specific resistance and electrically connecting the first source node to the source region of each of the plurality of load transistor cells, and a second source conductor having a second area specific resistance and electrically connecting the second source node to the source region of each of the plurality of sense transistor cells, wherein the area specific resistance of the second source conductor is greater than the area specific resistance of the first source conductor.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
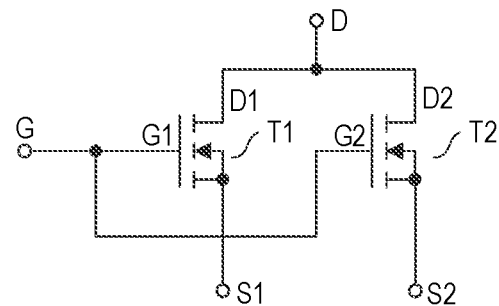
FIG. 1 shows a circuit diagram of a transistor arrangement with a load transistor and a sense transistor.

FIG. 1 shows a circuit diagram of one example of a transistor arrangement that includes a first transistor T1 and a second transistor device T2. In this type of transistor arrangement, the first transistor T1 may be used as an electronic switch that switches a current received by a load (not shown in FIG. 1), and the second transistor T2 may be used to sense the current flowing through the load transistor device. Thus, the first transistor T1 may also be referred to as load transistor and the second transistor T2 may also be referred to as sense transistor. Each of the first transistor T1 and the second transistor T2 has a first load node S1, S2, a second load node D1, D2, and a control node G1, G2. The control node G1 of the first transistor T1 and the control node G2 of the second transistor T2 are electrically connected so that the first transistor T1 and the second transistor T2 have a common control node G. Further, the second load node D1 of the first transistor T1 and the second load node D2 of the second transistor T2 are electrically connected so that the first transistor T1 and the second transistor T2 have a common second load node D.

According to one example, the first transistor T1 and the second transistor T2 are transistors of the same type. Just for the purpose of illustration, each of the first transistor T1 and the second transistor T2 is a MOSFET (Metal Oxide Semiconductor Field-Effect Transistor), in particular, an n-type enhancement MOSFET, as shown in FIG. 1. This, however, is only an example. Any other type of MOSFET or any other type of transistor device may be used to implement the first transistor T1 and the second transistor T2. When the transistors T1, T2 are MOSFETs, as shown in FIG. 1, the control node G1, G2 may also be referred to as gate node, the first load node S1, S2 may also be referred to as source node, and the second load node D1, D2 may also referred to as drain node.

Referring to the above, a transistor arrangement of the type shown in FIG. 1 may be used to supply a current to a load and, at the same time, measure the current supplied to the load. This is illustrated in FIG. 2, which shows one example of an electronic circuit that includes a transistor arrangement of the type shown in FIG. 1 and a load Z.

Figure 2:
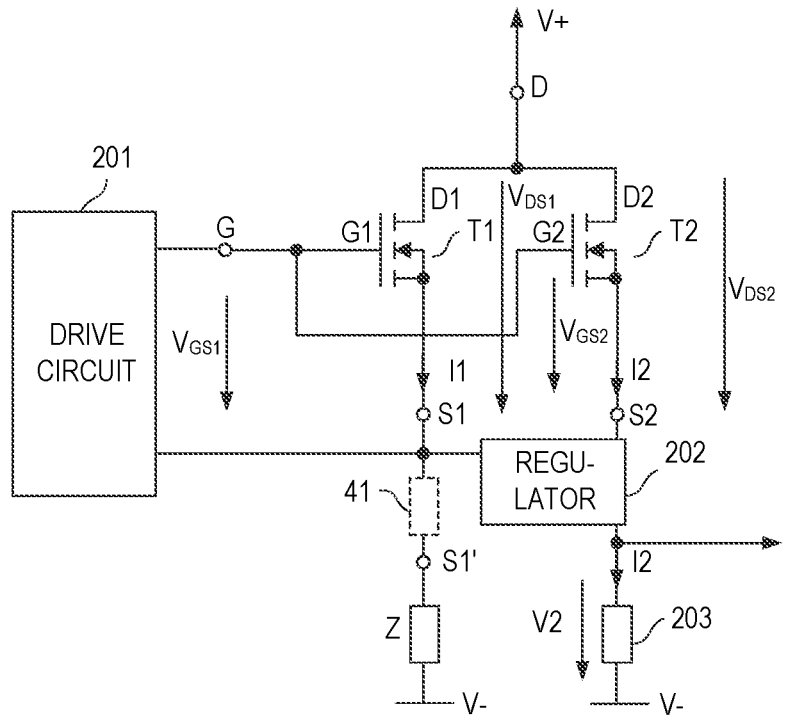
FIG. 2 shows a circuit diagram that illustrates one possible application of a transistor arrangement of the type shown in FIG. 1.

In the electronic circuit shown in FIG. 2, the transistor arrangement is configured to supply a current I1, which may be referred to as load current, to a load Z. For this, a load path of the first transistor device T1, which is a current path between the first load node S1 and the second load node D1 is connected in series with the load Z, wherein the series circuit with the first transistor device T1 and the load Z is connected between a first supply node and a second supply node. A first supply potential V+ is available at the first supply node and a second supply potential V− different from the first supply potential is available at the second supply node. The first supply potential may be a positive supply potential and the second supply potential may be a negative supply potential or ground potential. A drive circuit 201 is connected to a drive input of the first transistor T1 and configured to provide a drive voltage $V_{GS1}$ to the first transistor T1. The "drive input" of the first transistor T1 includes the common control node G and the first load node S1 of the first transistor. Based on the drive voltage $V_{GS1}$, the first transistor device T1 switches on or off. More specifically, the first transistor T1 switches on, to be in an on-state, when the drive voltage $V_{GS1}$ is higher than a threshold voltage of the first transistor T1 and switches off, to be in an off-state, when the drive voltage $V_{GS1}$ is lower than the threshold voltage of the first transistor T1. In the on-state, the first transistor T1 conducts a current so that a current level of the load current I1 is greater than zero. In the off-state, the first transistor T1 blocks, so that the current level of the load current I1 is zero.

The load Z may be any type of electric load or electric network. According to one example, the first transistor T1 and the load Z form a switched-mode voltage converter such as, for example, a buck converter, a boost converter, a flyback converter, or the like.

Referring to FIG. 2, the electronic circuit further includes a regulator 202 that is coupled to the first load node S1 of the first transistor T1 and the first load node S2 of the second transistor T2. The regulator 202 is configured to regulate an electrical potential at the first load node S2 of the second transistor device T2 such that this potential at least approximately equals a potential at the first load node S1 of the first transistor T1. When the electrical potentials at the first load nodes S1, S2 are equal, the first transistor T1 and the second transistor T2 are in the same operating point. That is, the drive voltage $V_{GS1}$ received by the first transistor T1 equals a second drive voltage $V_{GS2}$ received by the second transistor device T2 and a load path voltage $V_{DS1}$ between the second load node D1 and the first load node S1 of the first transistor device T1 equals a second load path voltage $V_{DS2}$ between the second load node D2 and the first load node S2 of the second transistor device T2. In the following, "common load path voltage $V_{DS}$" denotes the load path voltage of both transistors T1, T2 when the first and second load path voltages $V_{DS1}$, $V_{DS2}$ are equal, that is, $V_{DS}=V_{DS1}=V_{DS1}$. Further, "common drive voltage $V_{GS}$" denotes the drive voltage of both transistors T1, T2 when the first and second drive voltages $V_{GS1}$, $V_{GS2}$ are equal, that is, $V_{GS}=V_{GS1}=V_{GS2}$.

Figure 3:
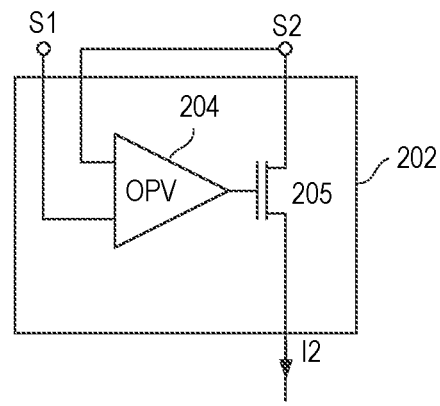
FIG. 3 shows one example of a regulator shown in FIG. 2.

FIG. 3 shows one example of the regulator 202. In this example, the regulator 202 includes an operational amplifier 204 and a variable resistor 205. A first input of the operational amplifier 204 is connected to the first load node S1 of the first transistor device T1 and a second input of the operational amplifier 204 is connected to the first load node S2 of the second transistor device T2. The variable resistor 205 is connected in series with the load path of the second transistor device T2 and controlled by the operational amplifier 204. Just for the purpose of illustration, the variable resistor 205 is a MOSFET in the example shown in FIG. 3. The regulator 202 shown in FIG. 3 is configured to adjust a resistance of the variable resistor 205 such that the electrical potential at the first load node S2 of the second transistor device T2 essentially equals the electrical potential at the first load node S1 of the first transistor device T1.

When the second transistor T2 is operated in the same operating point as the first transistor T1 a current I2 through the second transistor device T2 is a representation of the load current I1 through the first transistor device T1 and the load Z. The second current I2 can therefore be used to measure the load current I1 and will be referred to as sense current in following. The sense current I2 may be measured in various ways. Just for the purpose of illustration, a resistor 203, which may be referred to as sense resistor is connected in series with the second transistor device T2. In this example, a voltage V2 across the sense resistor 203 represents the sense current I2.

Referring to FIG. 2, the regulator 201 and the load Z are connected to the first load node S1 of the load transistor T1. According to one example, the load Z is not directly connected to the first load node S1, but is connected to a further load node S1' which is connected to the first load node S1 via a conductor. This conductor is represented by a resistor 41 in the example shown in FIG. 2. According to one example, the load transistor T1, the sense transistor T2, and the regulator 202 are arranged in a common housing (which is not illustrated in FIG. 2). In this case, the further load node S1' is accessible outside the housing and may be referred to as external load node. The first load node S1 is not accessible outside the housing and may be referred to as internal node.

The drive voltage $V_{GS1}$ provided by the drive circuit 201 may be applied between the common gate node G1 and the internal load node S1 or between the common gate node G1 and the external load node S1' of the load transistor. In the latter case, the voltage between the common gate node and the internal load node S1 is smaller than the drive voltage $V_{GS1}$ provided by the drive circuit 201 and is given by the drive voltage $V_{GS1}$ minus a voltage V41 across the conductor 41, wherein this voltage is given by a resistance R41 of the resistor 41 multiplied with the load current I1. In each case, the regulator 202 regulates the voltage $V_{GS2}$ between the common gate node G and the first load node S2 of the sense transistor T2 such that this voltage equals the voltage between the common gate node G and the internal load node S1 of the load transistor T1.

The first transistor T1 and the second device T2 can be designed such that the sense current I2 is much smaller than the load current I1 when both transistors are operated in the same operating point. This may help to minimize losses that are associated with measuring the load current I1. A ratio or proportionality factor between the load current I1 and the sense current I2 is greater than 10000 ($10^4$), greater than 30000 ($3 \times 10^4$), or even greater than 50000 ($5 \times 10^4$). This ratio is referred to as current proportionality factor $k_{ILIS}$ in the following, that is, $$k_{ILIS} = \frac{I1}{I2}.$$

In an ideal case, the proportionality factor between the load current I1 and the sense current I2 is predefined, known, and independent of the operating point of the first transistor T1 and the second transistor T2, so that in each operating point the load current I1 is given by the sense current I2 multiplied with the predefined and known proportionality factor. However, designing the second transistor T2 such that (a) the sense current I2 is small, and (b) the proportionality factor is great, such as greater than $10^4$, may cause the proportionality factor to vary as the operating point varies. This is explained in the following. A variation of the operating point may be caused by a variation of the common drive voltage $V_{GS}$ or the common load path voltage $V_{DS}$.

Figure 4:
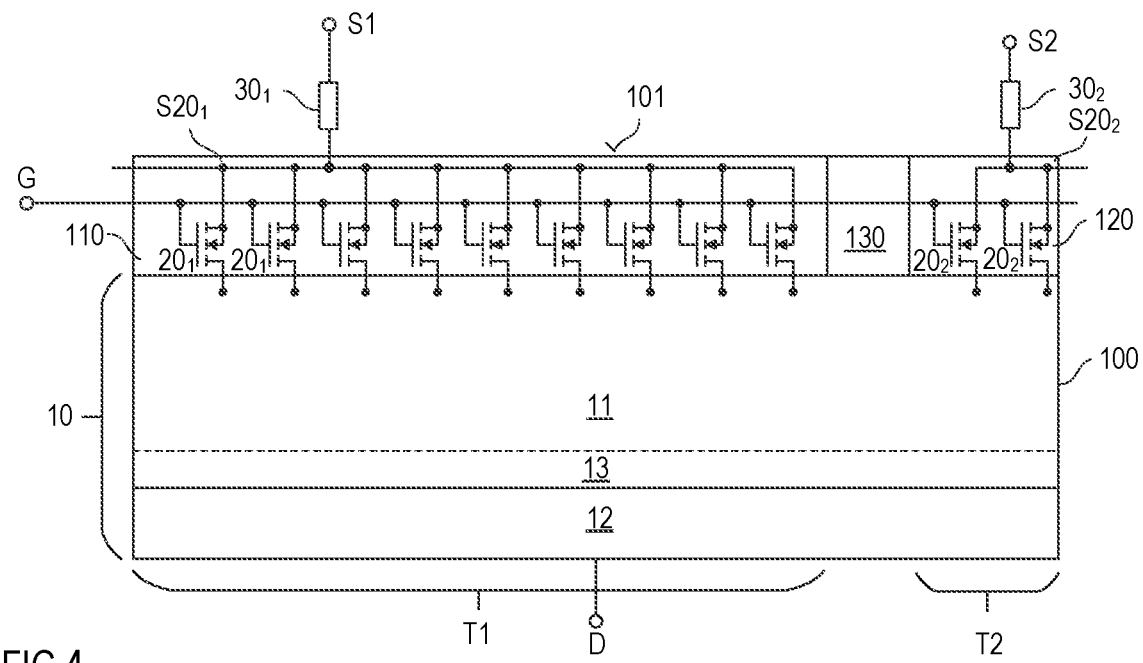
FIG. 4 illustrates how active regions of the load transistor and the sense transistor may be integrated in a semiconductor body.

FIG. 4 schematically illustrates one example of how the transistor arrangement with the first transistor T1 and the second transistor T2 may be implemented using a common semiconductor body 100. FIG. 4 illustrates a vertical cross sectional view of one section of the semiconductor body 100. In this section, active regions of the first transistor T1 and the second transistor T2 are integrated. Just for the purpose of illustration it is assumed that each of the first transistor T1 and the second transistor T2 is a MOSFET. Thus the common second load node D is referred to as common drain node, the common control node G is referred to as common gate node. Further, the first load node S1 of the first transistor T1 is referred to as first source node and the first load node S2 of the second transistor T2 is referred to as second source node.

Referring to FIG. 4, the transistor arrangement includes a drift and drain region 10 that is arranged in the semiconductor body 100 and connected to the common drain node D. A plurality of load transistor cells $20_1$ is integrated in a first region 101 that adjoins the drift and drain region 10, and a plurality of sense transistor cells $20_2$ is integrated in a second region 120 that adjoins the drift and drain region 10. In FIG. 4, the load transistor cells $20_1$ are schematically illustrated by circuit symbols of transistors, and the sense transistor cells $20_2$ are schematically represented by circuit symbols of transistors. Each of the load transistor cells $20_1$ includes a source region integrated in the first region 110, and each of the sense transistor cells $20_2$ includes a source region integrated in the second region 120. In FIG. 4, these source regions are not explicitly shown, but are represented by source nodes $520_1$, $520_2$ of the circuit symbols representing the load transistor cells $20_1$ and the sense transistor cells $20_2$. The source region 5201 of each of the load transistor cells $20_1$ is electrically connected to the first source node S1 via a first source conductor $30_1$, and the source region 5202 of each of the plurality of sense transistor cells $20_2$ is electrically connected to the second source node S2 via a second source conductor $30_2$. Each of the first source conductor $30_1$ and the second source conductor $30_2$ has an area specific resistance, wherein the area specific resistance of the second source conductor $30_2$ is greater than the area specific resistance of the first source conductor $30_1$. The area specific resistance of the first source conductor $30_1$ is given by an electrical resistance $R30_1$ of the first source conductor $30_1$ multiplied with the size A1 of an area of the first region 110. The area specific resistance of the second source conductor $30_2$ is given by an electrical resistance $R30_2$ of the second source conductor $30_2$ multiplied with a size of an area of the second region 120. This is explained in further detail herein below.

In the transistor arrangement shown in FIG. 4, the load transistor cells $20_1$ and the first source conductor $30_1$ are part of the load transistor T1. Further, the sense transistor cells $20_2$ and the second source conductor $30_2$ are part of the sense transistor T2. The drift and drain region 10 is part of both the load transistor T1 and the sense transistor T2.

Referring to FIG. 4, the drift and drain region 10 may include a drift region 11 and a drain region 12. In this case, the drift region adjoins the first and second regions 110, 120 and is arranged between the first and second regions 110, 120 and the drain region. The drift region 11 is more lowly doped than the drain region 12 and may adjoin the drain region 12. Optionally, a field-stop region 13, which is more highly doped than the drift region 11 and more lowly doped than the drain region 12, may be arranged between the drift region 11 and the drain region 12. When the load transistor T1 and the sense transistor T2 are n-type MOSFETs the drain region 12, the drift region 11, and the optional field-stop region 13 are n-doped. When the load transistor T1 and the sense transistor T2 are p-type MOSFETs, the drain region 12, the drift region 11 and the optional field-stop regions 13, are p-doped. A doping concentration of the drain region 12 is, for example, in a range of between 1E19 cm$^{-3}$ and 1E21 cm$^{-3}$. A doping concentration of the drift region 13 is, for example, between 1E15 cm$^{-3}$ and 5E17 cm$^{-3}$.

Each of the load transistor T1 and the sense transistor T2 has an on-resistance, which is the electrical resistance between the common drain node D and the respective source node S1, S2. In the following, $R_{ON1}$ denotes the on-resistance of the load transistor T1 and $R_{ON2}$ denotes the on-resistance of the sense transistor T2.

In accordance with Ohm's law, the load current I1 is given by the quotient of the common load path voltage $V_{DS}$ and the on-resistance $R_{ON1}$ of the load transistor T1, $$I1 = \frac{V_{DS}}{R_{ON1}}, \quad (1a)$$

and the sense current I2 is given by the quotient of the common load path voltage $V_{DS}$ and the on-resistance of the sense transistor $R_{ON2}$, $$I2 = \frac{V_{DS}}{R_{ON2}}. \quad (1b)$$

Based on equations (1a) and (1b) it can be shown that the current proportionality factor $k_{ILIS}$ is dependent on the on-resistances $R_{ON1}$, $R_{ON2}$ as follows:

$$k_{ILIS} = \frac{I1}{I2} = \frac{R_{ON2}}{R_{ON1}}. \quad (2)$$

Figure 5:
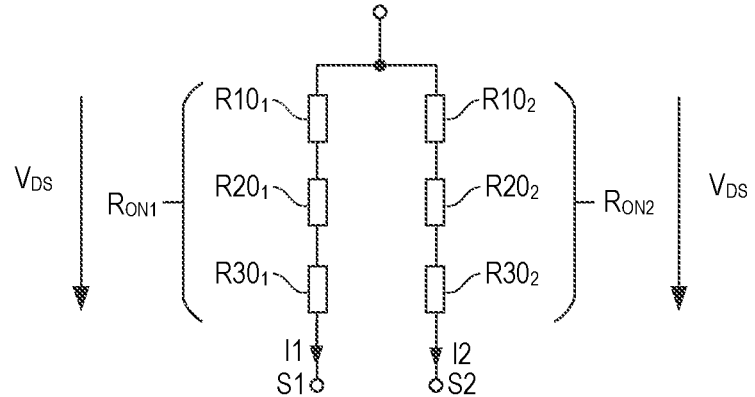
FIG. 5 shows a circuit diagram of the transistor arrangement illustrated in FIG. 4 in an on-state of the transistor arrangement.

Each of these on-resistances $R_{ON1}$, $R_{ON2}$ is comprised of several resistances of different regions or structures in the transistor arrangement. This is explained with reference to FIG. 5, which shows the electrical circuit diagram of a transistor arrangement of the type shown in FIG. 4 in the on-state of the transistor arrangement (that is, in the on-state of the load transistor T1 and the sense transistor T2). Referring to FIG. 5, the on-resistance $R_{ON1}$ of the load transistor T1 includes a series circuit with a drift and drain region resistance R10$_1$, a transistor cell resistance R20$_1$, and a source conductor resistance R30$_1$. Equivalently, the on-resistance $R_{ON2}$ of the sense transistor T2 includes a drift and drain region resistance R10$_2$, a transistor cell resistance R20$_2$, and a source conductor resistance R30$_2$. The source conductor resistance R30$_1$ of the load transistor T1 is the electrical resistance of the source conductor 30$_1$ between the first source node S1 and the load transistor cells 20$_1$. Equivalently, the source conductor resistance R30$_2$ of the sense transistor T2 is the electrical resistance of the source conductor 30$_2$ between the second source node S2 and the sense transistor cells 20$_2$. The transistor cell resistance R20$_1$ of the load transistor T1 is the electrical resistance of the parallel circuit with the plurality of load transistor cells 20$_1$ in the on-state of the load transistor cells 20$_1$. Equivalently, the transistor cell resistance R20$_2$ of the sense transistor cells 20$_2$ is the electrical resistance of the parallel circuit with the plurality of sense transistor cells 20$_2$ in the on-state. The drift and drain region resistance R10$_1$ of the load transistor T1 is the electrical resistance of the drift and drain region 10 between the parallel circuit with the plurality of load transistor cells 20$_1$ in the first region 110 and the drain node D. Equivalently, the drift and drain region resistance R10$_2$ of the sense transistor T2 is the electrical resistance of the drift and drain region 10 between the parallel circuit with the plurality of sense transistor cells 20$_2$ in the second region 120 and the drain node D.

The transistor cell resistances R20$_1$, R20$_2$ are dependent on the operating state and the number of transistor cells. That is, the transistor cell resistance R20$_1$ of the load transistor T1 is dependent on the common drive voltage $V_{GS}$ received by the load transistor T1 and the number of load transistor cells 20$_1$ integrated in the first region 110 and connected in parallel, and the transistor cell resistance R20$_2$ of the sense transistor T2 is dependent on the common drive voltage $V_{GS}$ received by the sense transistor T2 and the number of sense transistor cells 20$_2$ integrated in the second region 120 and connected in parallel. According to one example, the load transistor cells 20$_1$ and the sense transistor cells 20$_2$ are implemented in the same fashion such that the size of the first area 110 is proportional to the number of load transistor cells 20$_1$ integrated therein and the size of the second area 120 is proportional to the number of sense transistor cells 20$_2$ integrated therein. In this case, when the load transistor T1 and the sense transistor T2 are operated in the same operating point (receive the same drive voltage $V_{GS}=V_{GS1}=V_{GS2}$) the transistor cell resistance R20$_1$ of the load transistor T1 is proportional to the transistor cell resistance R20$_2$ of the sense transistor T2, with a proportionality factor being given by a ratio between a size A1 of the first region 110 and a size A2 of the second region 120, so that $$\frac{R20_1}{R20_2} = \frac{A2}{A1}. \quad (3)$$

In the following, A1·R20$_1$ denotes an area specific resistance of the load transistor cells 20$_1$, which is the electrical resistance of the parallel circuit with the load transistor cells 20$_1$ in relation to the size A1 of the active region 110. Equivalently, A2·R20$_2$ denotes an area specific resistance of the sense transistor cells 20$_2$, which is the electrical resistance of the parallel circuit with the sense transistor cells 20$_2$ in relation to the size A2 of the second region 120. Using equation (3) it can be shown that these area specific resistances are equal, that is, A1·R20$_1$=A2·R20$_2$. It should be noted that due to imperfections and variations in the manufacturing process of the transistor arrangement these area specific resistances may not exactly be equal. According to one example, "equal area specific resistances" as used herein include area specific resistances that deviate from one another by less than +/−2% of an average of the area specific resistances.

Referring to FIG. 4, an inactive region 130 is arranged between the first region 110 and the second region 120. The inactive region 130 does not include active transistor cells so that no current flows in the inactive region 130. However, a current from the load transistor cells $20_1$ integrated in the first region 110 and from the sense transistor cells $20_2$ integrated in the second region 120 can flow in the drift and drain region 10 below the inactive region 130. Thus, a cross sectional area of the drift and drain region 10 in which the load current I1 from the load transistor cells $20_1$ flows through the drift and drain region 10 is greater than the size A1 of the first region 110. Equivalently, a cross sectional area of the drift and drain region 10 in which the sense current I2 from the sense transistor cells $20_2$ flows through the drift and drain region 10 is greater than the size A2 of the second region 120. Based on this, a ratio between the drift and drain region resistance $R10_1$ of the load transistor T1 and the drift and drain region resistance $R10_2$ of the sense transistor T2 can be expressed as $$\frac{R10_1}{R10_2} = \frac{A2 + \Delta A2}{A1 + \Delta A1}, \quad (4)$$

where ΔA1 denotes the size of an additional area where the load current I1 flows below the inactive region. This inactive region may include the inactive region 130 that is shown in FIG. 4 and is arranged between the first region 110 and the second region 120 and other inactive regions (not shown in FIG. 4) that adjoin the first region 110 in lateral (horizontal) directions of the semiconductor body 100. "Lateral directions" are directions perpendicular to a first surface 101 of the semiconductor body 100. Equivalently, ΔA2 denotes the size of an additional area of the drift and drain region 10 below the inactive region where the sense current may flow. This inactive region may include the inactive region 130 below the first region 110 and the second region 120 shown in FIG. 4 and other inactive regions adjoining the second region 102 in lateral (horizontal) directions.

The effect that the load current I1 does not only flow below the first region 110 through the drift and drain region 10 and that the sense current I2 does not only flow below the second region 120 through the drift and drain region 10 may be referred to as current spreading.

The size of the additional areas ΔA1, ΔA2 is not linearly dependent on the sizes A1, A2 of the first region 110 and the second region 120. (In a first approximation, ΔA1 can be considered to be proportional to a square root of A1, and ΔA2 can be considered to be proportional to the square root of A2). Moreover, it can be shown that a ratio between the size of the additional area (ΔA1, ΔA2 in the example explained above) and the size of the corresponding transistor cell region (110, 120 in the example explained above) increases as the size of the transistor cell region decreases. Based on this and as the size of the first (transistor cell) region 110 is much greater than the size of the second (transistor) cell region 120, a ratio between the size of the additional area ΔA2 and the size A2 of the second region 120 is greater than a ratio between the size of the additional area ΔA1 and the size A1 of the first region 110, that is, $$\frac{\Delta A2}{A2} > \frac{\Delta A1}{A1}. \quad (5)$$

Based on equations (4) and (5) it can be shown that an area specific drift and drain region resistance $A1 \cdot R10_1$ of the load transistor T1 is greater than an area specific drift and drain resistance $A2 \cdot R10_2$ of the sense transistor T2, $$A1 \cdot R10_1 > A2 \cdot R10_2 \quad (6).$$

The smaller the size A2 of the second region 120 relative to the size of the first region, the greater the difference between the area specific drift and drain region resistance $A1 \cdot R10_1$ of the load transistor T1 and the area specific drift and drain region resistance $A2 \cdot R10_2$ of the sense transistor T2. Further, this difference increases as a size of the inactive region 130 increases relative to the size of the second region 120. According to one example, a shortest distance between the first region 110 and the second region 120 is greater than 0.5 times the square route of the size A2 of the second region 120, that is, $$d1 > 0.5\sqrt{A2} \quad (7),$$

where d1 denotes the shortest distance between the first region 110 and the second region 120.

Referring to the above, the transistor cell resistances $R20_1$, $R20_2$ are dependent on the drive voltage $V_{GS}$. The drift and drain region resistances $R10_1$, $R10_2$ and the source conductor resistances, however, are widely independent of the drive voltage $V_{GS}$. That is, each of the first and second on-resistance Rom, Rom includes a drive voltage dependent portion and a drive voltage independent portion. It can be shown that the current proportionality factor $k_{ILIS}$ as given by equation (1) is widely independent of the drive voltage $V_{GS}$ when this current proportionality factor $k_{ILIS}$ essentially equals the ratio between the drive voltage dependent portions, which is the ratio between the transistor cell resistances $R20_1$, $R20_2$. That is, the current proportionality factor $k_{ILIS}$ is independent of the drive voltage $V_{GS}$ if the following applies:

$$k_{ILIS} = \frac{R_{ON2}}{R_{ON1}} = \frac{A_1}{A_2}, \quad (8)$$

or $$A1 \cdot R_{ON1} = A2 \cdot R_{ON2}, \quad (9)$$

where $A1 \cdot R_{ON1}$ denotes an area specific on-resistance of the load transistor T1 and $A2 \cdot R_{ON2}$ denotes an area specific on-resistance of the sense transistor T2. $A1 \cdot R_{ON1}$ will also be referred to as first area specific on-resistance in the following and $A2 \cdot R_{ON2}$ and will also be referred to as second area specific on-resistance in the following. The more these area specific on-resistances, at a given drive voltage, deviate from one another, the higher is the dependency of the current proportionality factor $k_{ILIS}$ on the drive voltage $V_{GS}$. By virtue of the current spreading effect explained above, portions of the area specific on-resistance resulting from the transistor cell resistances $R20_1$, $R20_2$ and the drift and drain region resistances $R10_1$, $R10_2$ are not equal, that is, $$A1 \cdot (R20_1 + R10_1) \neq A2 \cdot (R20_2 + R10_2) \quad (10),$$

wherein the more a ratio $$\frac{\Delta A_2}{\Delta A_1}$$

between the sizes of the additional areas ΔA2, ΔA1 deviates from the ratio $$\frac{A_2}{A_1}$$

of the sizes A2, A1 of the first and second regions 110, 120, the greater a difference between these portions.

Figure 6:
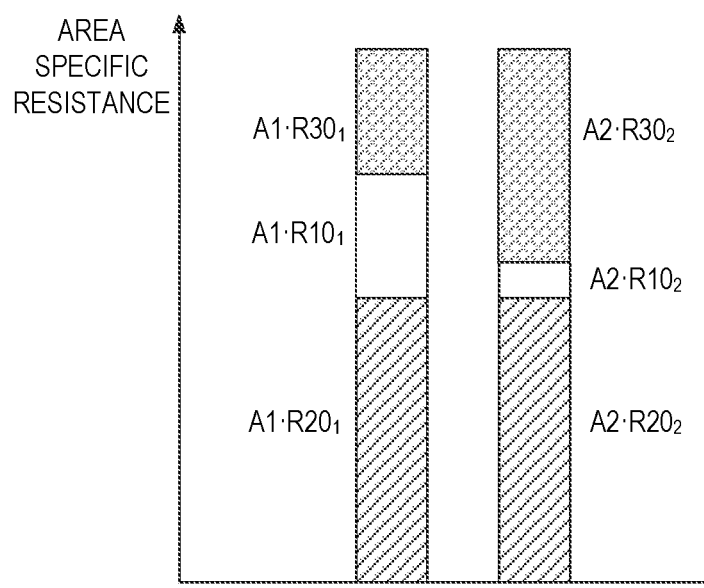
FIG. 6 illustrates how area specific resistances of the load transistor and the sense transistor are composed of area specific resistances of different sections of the load transistor and the sense transistor.

Equation (10) is visualized in FIG. 6 that illustrates the area specific transistor cells resistances A1·R20$_1$, A2·R20$_2$ and the area specific drift and drain region resistances A1·R10$_1$, A2·R10$_2$. As illustrated in FIG. 6, and as explained above, the area specific drift and drain region resistance A2·R10$_2$ of the sense transistor T2 is smaller than the area specific drift and drain region resistance A1·R10$_1$ of the load transistor T1. If the on-resistances R$_{ON1}$, R$_{ON2}$ would only be comprised of the transistor cell resistances R20$_1$, R20$_2$ and the drift and drain region resistances R10$_1$, R10$_2$ the current proportionality factor would not only be different from the size ratio A1/A2, but, even more important, be dependent on the drive voltage. This is because the transistor cell resistances R20$_1$, R20$_2$ are dependent on the drive voltage VGS and the drift and drain region resistances R10$_1$, R10$_2$ are widely independent on the drive voltage V$_{GS}$.

In order to at least partially compensate the dependency of the proportionality factor k$_{ILIS}$ on the drive voltage V$_{GS}$ the resistances R30$_1$, R30$_2$ of the source conductors 30$_1$, 30$_2$ are suitably designed. In particular, the source conductor resistance R30$_2$ of the sense transistor T2 is designed such that the area specific on-resistance A1·R$_{ON1}$, of the load transistor T1 and the area specific on-resistance A2·R$_{ON2}$ of the sense transistor T2 converge in order to at least reduce a dependency of the current proportionality factor k$_{ILIS}$ on the drive voltage V$_{GS}$. More specifically, the second source conductor 30$_2$ is designed such that an area specific resistance A2·R30$_2$ of the second source conductor 30$_2$, which is the resistance R30$_2$ of the second source conductor 30$_2$ in relation to the area A2 of the second region 120, is greater than an area specific source conductor resistance A1·R30$_1$ of the first source conductor 30$_1$, which is the resistance R30$_1$ of the first source conductor 30$_1$ in relation to the size A1 of the first region 110.

Just for the purpose of illustration, in the example shown in FIG. 6, the area specific source conductor resistances A1·R30$_1$, A2·R30$_2$ are selected such that the area specific on-resistances A1·R$_{ON1}$, A2·R$_{ON2}$ of the load transistor T1 and the sense transistor T2 are equal. This represents the ideal case in which the current proportionality factor k$_{ILIS}$ can be considered to be independent of the drive voltage V$_{GS}$. This, however, is only an example. An improvement in view of reducing the dependency of the current proportionality factor k$_{ILIS}$ on the drive voltage V$_{GS}$ is already obtained by simply making the area specific resistance A2·R30$_2$ of the second source conductor 30$_2$ greater than the area specific source conductor resistance A1·R30$_1$ of the first source conductor 30$_1$.

According to one example, the area specific resistance A2·R30$_2$ of the second source conductor 30$_2$ is designed such that it is adapted to the area specific resistance A1·R30$_1$ of the first source conductor 30$_1$ and the area specific drift and drain resistances A1·R10$_1$, A2·R10$_2$ of the of the load transistor T1 and the sense transistor T2 as follows:

$$R30_2 \cdot A2 = c \cdot (R10_1 \cdot A1 - R10_2 \cdot A2) + R30_1 \cdot A1 \quad (11),$$

where c is a constant selected from between 0.5 and 1.5. According to another example, c is selected from between 0.8 and 1.2. If c=1, the area specific on-resistances A1·R$_{ON1}$, A2·R$_{ON2}$ are equal.

Figure 7A:
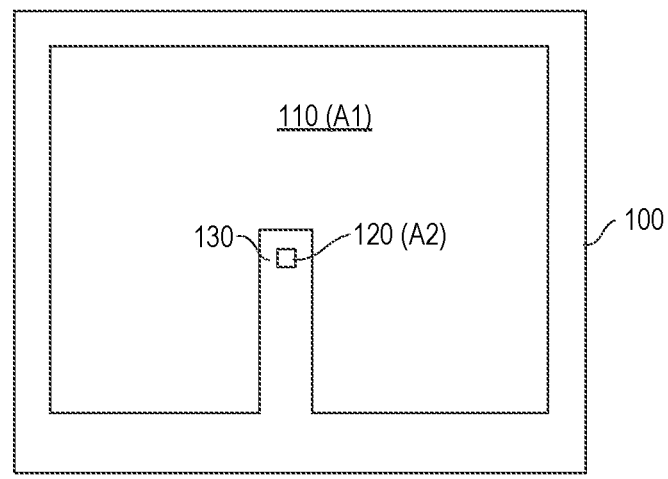
FIGS. 7A to 7C show different horizontal cross sectional views that illustrates how a first active region with load transistor cells and a second active region with sense transistor cells may be arranged in a semiconductor body.

FIG. 7A schematically illustrates a top view of the semiconductor body 100 in order to illustrate how the first region 110 and the second region 120 may be arranged in the semiconductor body 100. In this example, the first region 110 and the second region 120 are implemented such that the second region 120 is essentially rectangular and the first region 110 is adjacent the second region 120 on three sides of the second region 120. The inactive region 130 surrounds the first region 110 and, as explained with reference to FIG. 5, separates the second region 120 from the first region 110.

Figure 7B:
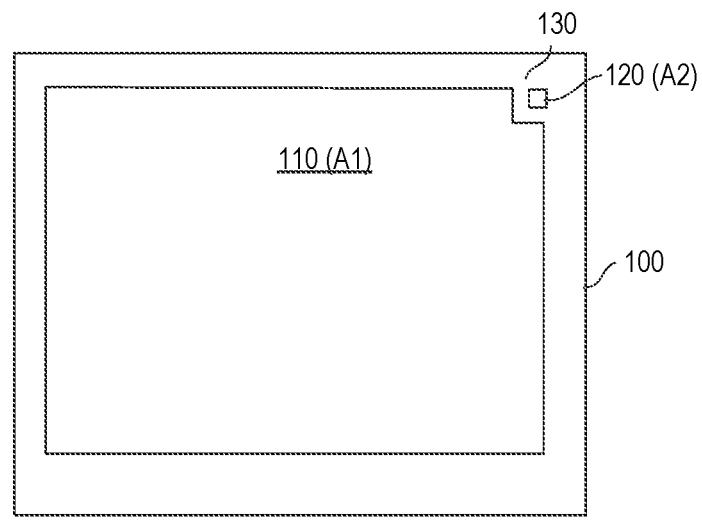
Figure 7C:
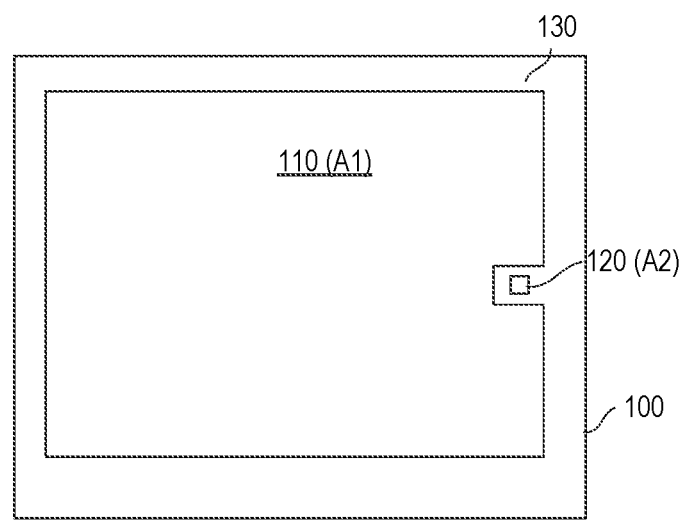

The arrangement shown in FIG. 7A is only one example. According to another examples shown in FIGS. 7B and 7C, the second region may be arranged in a corner or in a region of an outer edge of the first region 110.

Figure 8A:
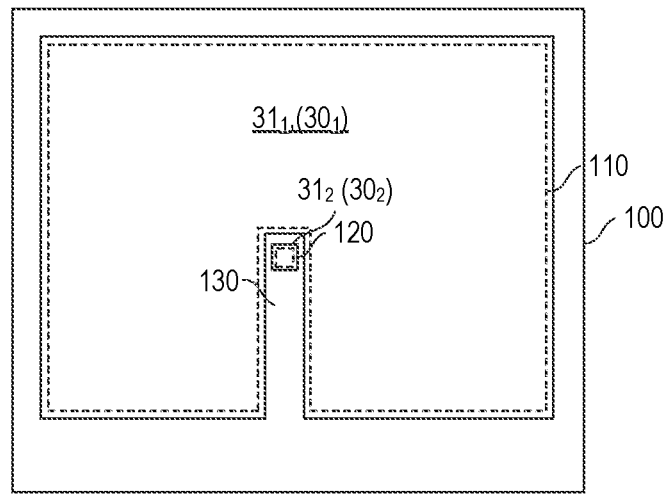
FIGS. 8A and 8B show a top view of a first source metallization and a second source metallization in an arrangement of the type shown in FIG. 7, and a top view of a first source pad and a second source pad in an arrangement of the type shown in FIG. 8.
Figure 8B:
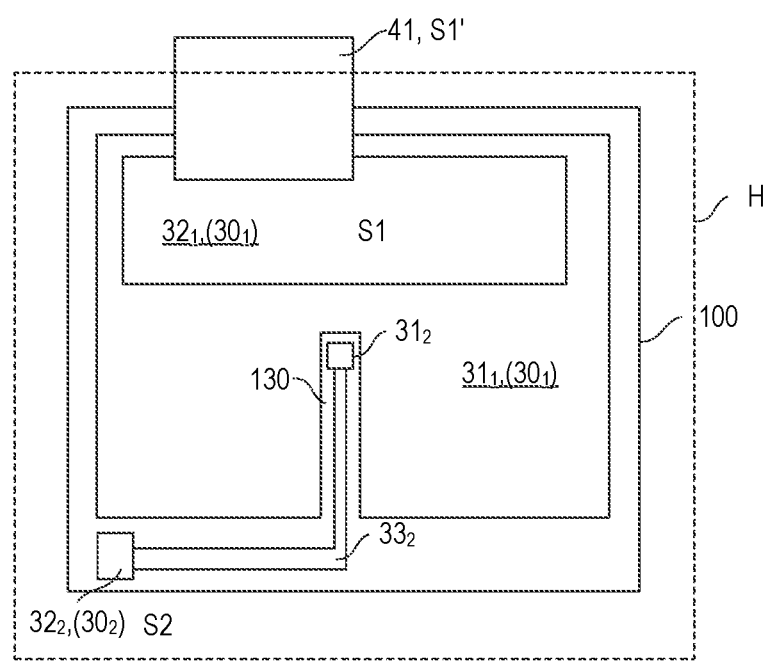

FIGS. 8A and 8B illustrate one example of how the first source conductor 30$_1$ and the second source conductor 30$_2$ may be implemented. In this example, each of the first source conductor 30$_1$ and the second source conductor 30$_2$ includes a metallization layer 31$_1$, 31$_2$ on the first region 110 and the second region 120, respectively. A top view of these metallization layers 31$_1$, 31$_2$ is shown in FIG. 8A. The first region 110 and the second region 120 below these metallization layers 31$_1$, 31$_2$ are illustrated in dashed lines in FIG. 8A. According to one example, the metallization layers 31$_1$, 31$_2$ include at least one of aluminium (Al), copper (Cu), titanium (Ti), gold (Au), silver (Ag), or the like.

Referring to FIG. 8B, each of the source conductors 30$_1$, 30$_2$ further includes a contact pad 32$_1$, 32$_2$. The contact pad 32$_1$ of the first source conductor 30$_1$ forms the first source node S1 or is electrically connected to the first source node S1. The contact pad 32$_2$ of the second source conductor 30$_2$ forms the second source node S2 or is electrically connected to the second source node S2. The semiconductor body 100 may be arranged in a housing H (illustrated in dashed lines in FIG. 8B). When the semiconductor body 100 is arranged in a housing, the contact pads 32$_1$, 32$_2$ are not directly accessible. In this case, the first source node S1 (the first load node of the load transistor T1) and the second source node S2 (the first load node of the sense transistor T2) are internal load nodes. Both the regulator 202 (not shown in FIG. 8B) and the external load node S1' are connected to the contact pad 32$_1$ of the first source conductor 30$_1$. The external load S1' is accessible outside the housing and may be formed by a flat conductor 41 connected to the contact pad 32$_1$ and protruding from the housing. This flat conductor 41 is represented by the resistor 41 shown in FIG. 2. Alternatively (not shown), the external load node S1' is formed by an electrically conducting leg protruding from the housing H and one or more bond wires connecting the leg to the contact pad 32$_1$. Further legs or flat conductors protruding from the housing H and forming or being connected to the common gate node G and the common second load node D are not shown in FIG. 8B.

The regulator 202 may be arranged inside the housing H and be connected to the internal load node S1 of the load transistor T1, that is, the contact pad 32$_1$ of the first source conductor 30$_1$, and to the first load node S2 of the sense transistor T2, that is, the contact pad 32$_2$ of the second source conductor 30$_2$, by conductors such as bond wires, flat conductors, or the like. A resistance of a conductor connecting the regulator 202 to the internal load node S1 is negligible in view of the resistance of the source conductor 30$_1$ because an input of the regulator 202 connected to the internal load node S1 is high-ohmic so that the load current I1 does not flow via this conductor. The resistance of this conductor, therefore, does not contribute to the resistance of the first source conductor $30_1$. A resistance of the conductor connecting the contact pad $32_2$ of the second source conductor $30_2$ to the regulator $20_2$ does contribute to the resistance of the second source conductor $30_2$ as the sense current I2 flows through this conductor (and the regulator 202). However, this electrical resistances is negligible as compared to electrical resistances of the metallization $31_2$, the contact pad $32_2$ and a conductor $33_2$ connecting the metallization $31_2$ with the contact pad $32_2$. The conductor $33_2$ may be arranged on the inactive region 130.

According to one example, the electrical resistance of the second source conductor $30_2$ is adjusted by adjusting the electrical resistance of the conductor $33_2$. Parameters of the conductor $33_2$ that may be varied in order to adjust the electrical resistance of the conductor $33_2$ include, but are not restricted to a length of the conductor $33_2$ between the metallization $31_2$ and the contact pad $32_2$; a cross section of the conductor $33_2$ in a direction perpendicular to a current flow direction; the material of the conductor $33_2$.

The desired resistance of the second source conductor $30_2$ and, in particular, the desired resistance of the conductor $33_2$ in order to achieve a specific on-resistance of the sense transistor T2 as explained with reference to FIGS. 5 and 6 may be determined by simulating the transistor arrangement using a conventional design tool (design software) for semiconductor devices and/or by measuring samples of the transistor arrangement.

Figure 9:
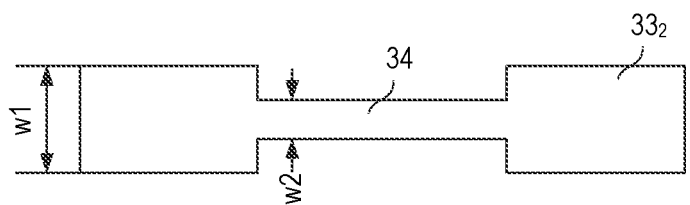
FIGS. 9 to 11 each illustrate examples of a conductor connecting the second source metallization with the second source pad.
Figure 10:
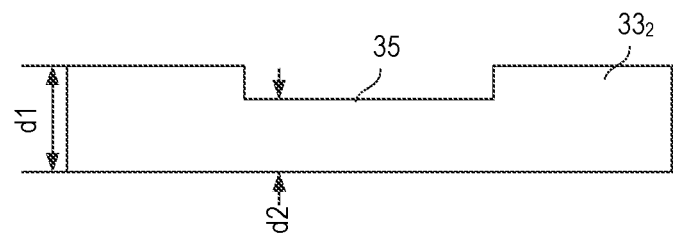
Figure 11:
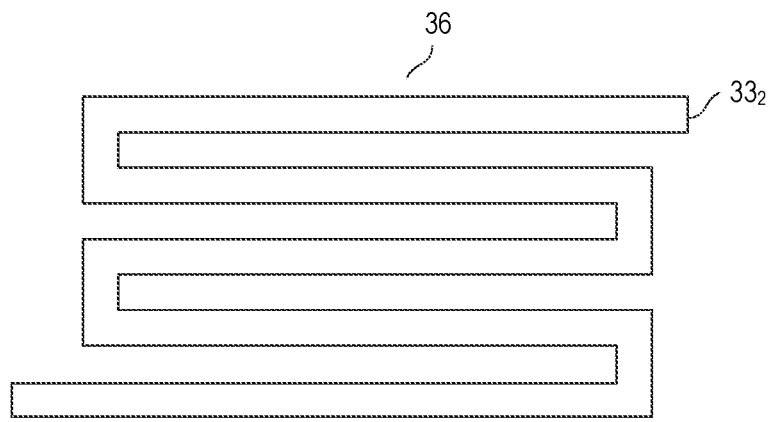

FIGS. 9 to 11 illustrate some specific examples of how the resistance of the conductor $33_2$ may be adjusted. FIG. 9 shows a top view of one section of the conductor $33_2$. In this example, the conductor $33_2$ has an essentially constant thickness (in a direction perpendicular to the drawing plane shown in FIG. 9) and a varying width in order to adjust the resistance. More specifically, in the example shown in FIG. 9, the conductor $33_2$ has a section 34 with a reduced width w2. That is, a width of the section 34 is smaller than a width w1 of sections adjoining the section 34 having the reduced width w2. Besides the width w2 of the section 34 a length 12 of the section 34 may be varied in order to adjust the resistance of the conductor $33_2$.

FIG. 10 shows a vertical cross sectional view of one section of a conductor $33_2$ according to one example. In this example, the conductor $33_2$ may have a constant width (in a direction perpendicular to the drawing plane illustrated in FIG. 10). Further, the conductor $33_2$ has a section 35 with a reduced thickness d2. That is, the thickness d2 of the section 35 is smaller than the thickness of adjoining sections.

FIG. 11 shows a top view of one section 36 of the conductor $33_2$ according to one example. In this example, the section 36 is meandering in order to increase the length of the conductor $33_2$. A width and a thickness of the conductor $33_2$ in the meandering section 36 may be constant.

It goes without saying that the measures illustrated in FIGS. 9 to 11 for adjusting the resistance of the conductor $33_2$ can be combined. That is, one conductor $33_2$ may include structures according to two or more of the examples illustrated in FIGS. 9 to 11 in order to adjust the resistance.

According to one example, the resistance of the conductor $33_2$ is in the range of between $2\Omega$ (ohms) and $30\Omega$, wherein the exact value is dependent on the specific type of transistor device, the proportionality factor $k_{ILIS}$ and the sizes of the first and second regions $A_1$, $A_2$. For example, the size of the active area, which is the size of the first region $A_1$ plus the size of the second region $A_2$ is 2 mm$^2$, the proportionality factor $k_{ILIS}$ is 30000 (3E4), and the on-resistance Rom of the load transistor T1 is 1.4 m$\Omega$ (milliohms). In order to achieve that the sense current I2 is $1/k_{ILIS}$ times the load current I1 the on-resistance $R_{ON2}$ of the sense transistor would have to be $k_{ILIS}$ times the on-resistance $R_{ON1}$ of the load transistor T1, that is 42$\Omega$ (=1.4 m$\Omega$·30000). However, simulations and measurements of samples of this type of transistor arrangement have revealed that, due to current spreading effects, the on-resistance $R_{ON2}$ of the sense transistor T2 is only about 32$\Omega$ so that an additional resistance of ion would be required. This additional resistor may be obtained by implementing the conductor $33_2$ as a trace made of AlCu (aluminum copper alloy) with a cross sectional area of 25.6 μm$^2$ (e.g., 8 μm wide and 3.2 μm high). A trace of this type has a resistance of 1$\Omega$ per millimeter so that the conductor $33_2$ may be implemented with a length of 10 millimeters to obtain a resistance of 10$\Omega$.

Figure 12:
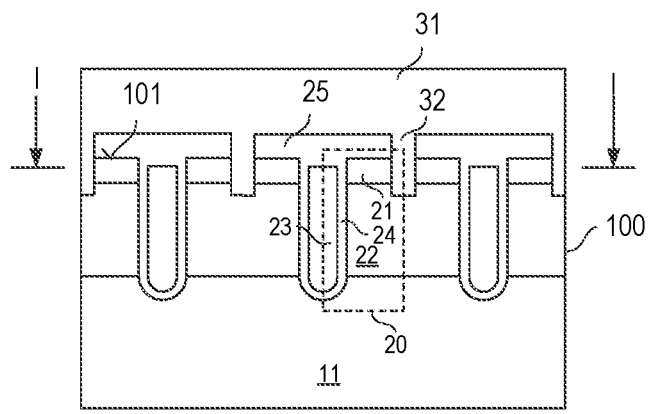
FIG. 12 illustrates a vertical cross sectional view of transistor cells according to one example that may be used in the load transistor or the sense transistor.

FIG. 12 schematically illustrates a cross sectional view of several transistor cells of the transistor arrangement. Transistor cells of the type illustrated in FIG. 12 may be used to implement the load transistor cells $20_1$ and the sense transistor cells $20_2$. Thus, reference character 20 in FIG. 12 represents an arbitrary one of the load transistor cells $20_1$ or sense transistor cells $20_2$. Referring to FIG. 12, one transistor cell 20 includes a body region 22 adjoining the drift and drain region 10. More specifically, the body region 22 adjoins the drift region 11. The body region 22 separates the drift region 11 from a source region 21. Further, a gate electrode 23 is adjacent the body region 22 and dielectrically insulated from the body region 22 by a gate dielectric 24. In a conventional fashion, the gate electrode 23 serves to control a conducting channel in the body region 22 between the source region 21 and the drift region 11. The source region 21 and the body region 22 of the transistor cell 20 are electrically connected to a metallization 31 that forms a part of the source conductor. The metallization 31 shown in FIG. 12 is the metallization $31_1$ of the first source conductor $30_1$ when the transistor cell 20 is a load transistor cell $20_1$, and the metallization 31 is the metallization $31_2$ of the second source conductor $30_2$ when the transistor cell 20 is a sense transistor cell $20_2$.

In the example shown in FIG. 12, the metallization 31 is electrically connected to the source region 21 and the body region 22 via a contact plug 32. This contact plug 32 is electrically (ohmically) connected to the source region 21 and the body region 22. Further, the metallization 31 is electrically insulated from the gate electrode 23 by an insulation layer 25. The gate electrode 23 is electrically connected to the common gate node G in a manner not illustrated in FIG. 12.

Figure 13:
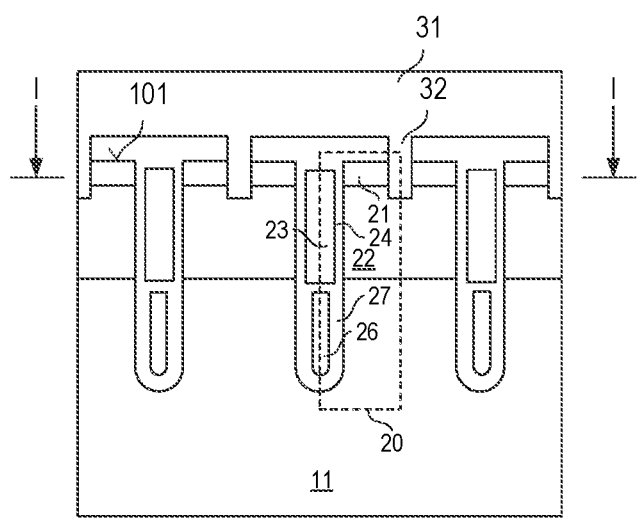
FIG. 13 illustrates a vertical cross sectional view of transistor cells according to another example that may be used in the load transistor or the sense transistor.

In a n-type MOSFET, the source region 21 is an n-type region and the body region 22 is a p-type region. In a p-type MOSFET, the source region 21 is a p-type region and the body region 22 is an n-type region FIG. 13 shows a modification of the transistor cell 20 shown in FIG. 12. The transistor cell 20 according to FIG. 13 additionally includes a field electrode 26 and a field electrode dielectric 27 that dielectrically insulates the field electrode 26 from the drift region 11. According to one example, the field electrode 26 is electrically connected to the source metallization 31. This connection, however, is not explicitly illustrated in FIG. 13.

The transistor cells 20 illustrated in FIGS. 12 and 13 are trench transistor cells. That is, the gate electrode 23 of each transistor cell 20 is arranged in a trench that extends from the surface 101 of the semiconductor body 100 into the semiconductor body 100. Implementing the transistor cells 20 as trench transistor cells, however, is only one example. According to another example, the transistor cells 20 are implemented as planar transistor cells, in which the gate electrode is arranged on top of the surface of the semiconductor body.

Figure 14:
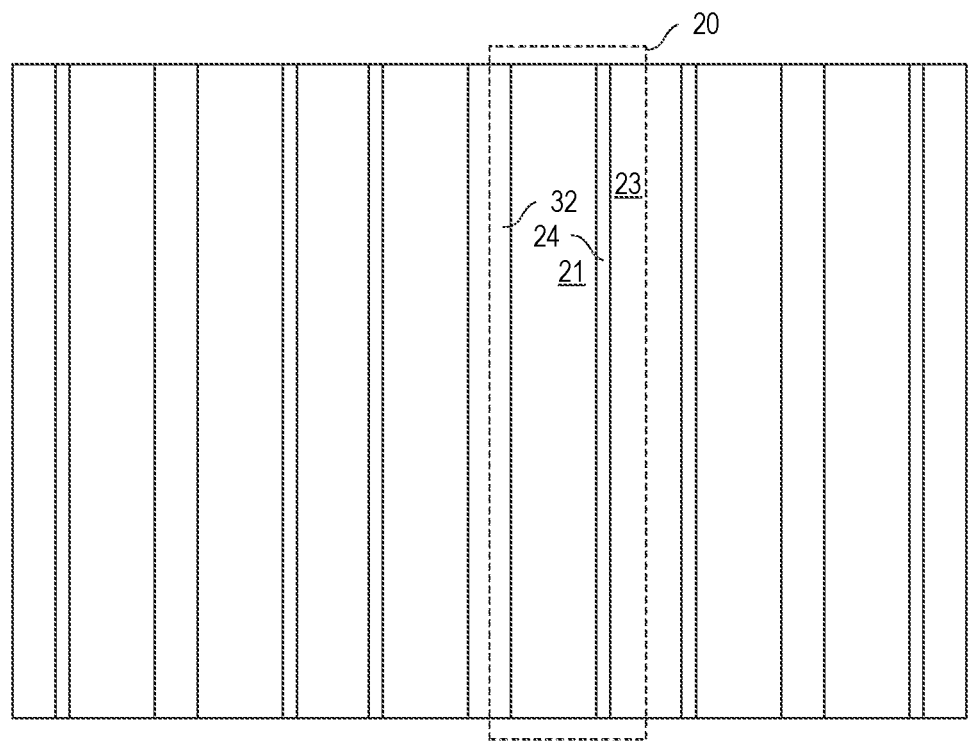
FIG. 14 shows one example of a horizontal cross sectional view of the transistor cells shown in FIG. 13 or 14.

FIG. 14 shows a horizontal cross sectional view of the transistor cells shown in FIG. 12 according to one example. In this example, the transistor cells are elongated transistor cells (stripe cells). That is, the gate electrodes 23, the source regions 21 and the body regions 22 are elongated in a horizontal direction of the semiconductor body 100. The "horizontal direction" is a direction parallel to the first surface 101.

Figure 15:
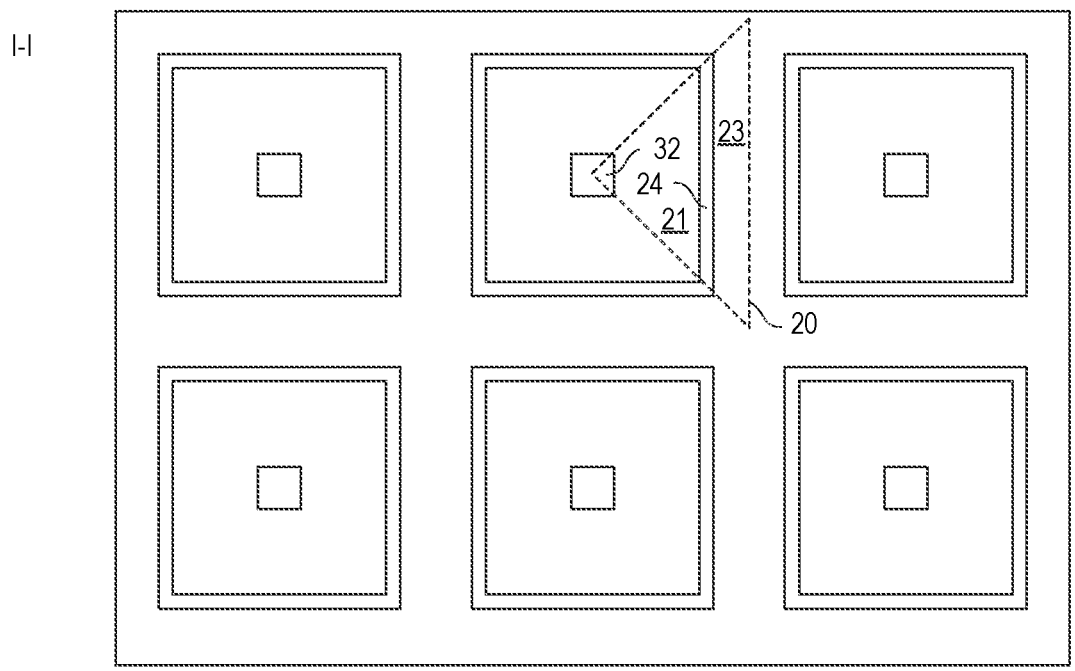
FIG. 15 shows another example of a horizontal cross sectional view of the transistor cells shown in FIG. 14 or 15.

FIG. 15 shows a horizontal cross sectional view of the transistor cells 20 according to another example. In this example, the gate electrode 23 has the shape of a rectangular grid that surrounds rectangular body regions (out of view in FIG. 15). The source region 21 has the form of a rectangular ring in this example. The individual transistor cells 20 can be considered as triangular transistor cells in this example. Implementing the gate electrode as a rectangular grid is only one example. A grid shaped gate electrode 23 may be implemented with other geometries, such as a hexagon, a pentagon, or the like.

Figure 16:
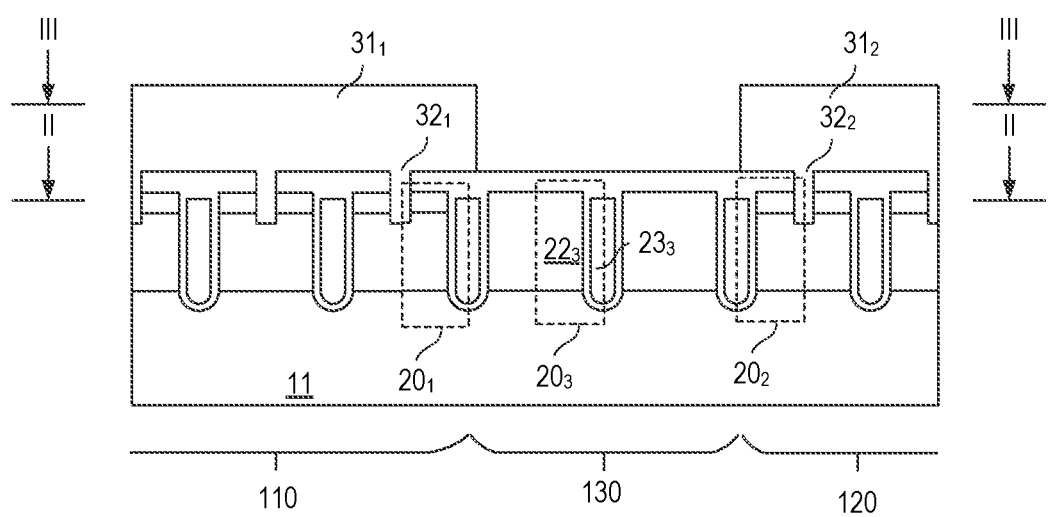
FIG. 16 shows one example of how an inactive region between the first active region and the second active region may be implemented.

FIG. 16 shows a vertical cross sectional view of the inactive region 130 according to one example. In this example, the inactive region 130 includes inactive transistor cells $20_3$. These inactive transistor cells include a gate electrode $23_3$. This gate electrode may be electrically connected with the gate electrodes of the load transistor cells $20_1$ and the sense transistor cells $20_2$. The inactive transistor cells $20_3$ include body regions but $22_3$ do not include source regions. For the purpose of illustration, load transistor cells $20_1$ and sense transistor cells $20_2$ integrated in those regions of the first region 110 and the second region 120 adjoining the inactive region 130 are also illustrated in FIG. 16. Just for the purpose of illustration, these transistor cells $20_1$, $20_2$ are implemented as explained with reference to FIG. 12. This, however, is only an example. The transistor cells $20_1$, $20_2$ may be implemented with other topologies as well.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of current detection, comprising:
providing a transistor arrangement which comprises a drift and drain region arranged in a semiconductor body and each connected to a drain node, a plurality of load transistor cells each comprising a source region integrated in a first region of the semiconductor body, a plurality of sense transistor cells each comprising a source region integrated in a second region of the semiconductor body, a first source node electrically connected to the source region of each of the plurality of the load transistor cells via a first source conductor, and a second source node electrically connected to the source region of each of the plurality of the sense transistor cells via a second source conductor; and
detecting a first current flowing between the drain node and the first source node of the transistor arrangement,
wherein detecting the first current comprises measuring a second current flowing between the drain node and the second source node of the transistor arrangement,
wherein detecting the first current comprises multiplying the second current by a current proportionality factor, wherein the current proportionality factor is a ratio between an on-resistance of the sense transistor cells and an on-resistance of the load transistor cells, and
wherein the on-resistance of the load transistor cells comprises a resistance of the first source conductor, wherein the on-resistance of the sense transistor cells comprises a resistance of the second source conductor, wherein the resistance of the second source conductor is different from the resistance of the first source conductor.

2. The method of claim 1, wherein measuring the second current comprises regulating an electric potential at the second source node such that the electric potential at the second source node at least approximately equals an electric potential at the first source node.

3. The method of claim 1, wherein the difference in resistance between the second source conductor and the first source conductor compensates for a difference between a second component of the on-resistance of the load transistor cells and a second component of the on-resistance of the sense transistor cells.

4. The method of claim 3, wherein the second component of the on-resistance of the load transistor cells is a drift and drain resistance of the load transistor cells, and wherein the second component of the on-resistance of the sense transistor cells is a drift and drain resistance of the sense transistor cells.

* * * * *